United States Patent
Lai et al.

(10) Patent No.: US 7,875,891 B2
(45) Date of Patent: Jan. 25, 2011

(54) LIGHT SOURCE DEVICE, LIGHT SOURCE MODULE, AND METHOD OF MAKING THE LIGHT SOURCE DEVICE

(75) Inventors: Chih-Ming Lai, Miao-Li Hsien (TW); Tse-An Lee, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 44 days.

(21) Appl. No.: 12/242,582

(22) Filed: Sep. 30, 2008

(65) Prior Publication Data
US 2009/0159904 A1    Jun. 25, 2009

(30) Foreign Application Priority Data
Dec. 19, 2007    (CN) .......................... 2007 1 020322

(51) Int. Cl.
*H01L 27/15* (2006.01)
*H01L 31/12* (2006.01)
*H01L 33/00* (2010.01)

(52) U.S. Cl. .............................. 257/88; 257/79; 257/84; 257/100

(58) Field of Classification Search ................... 257/88, 257/79, 80, 81, 82, 83, 84, 91, 100
See application file for complete search history.

(56) References Cited

U.S. PATENT DOCUMENTS

| | | | |
|---|---|---|---|
| 5,133,921 A * | 7/1992 | Yokoyama | 264/272.15 |
| 6,710,246 B1 * | 3/2004 | Mostafazadeh et al. | 174/528 |
| 7,176,506 B2 * | 2/2007 | Beroz et al. | 257/232 |
| 7,667,238 B2 * | 2/2010 | Erchak et al. | 257/98 |
| 7,671,373 B2 * | 3/2010 | Wang et al. | 257/81 |

FOREIGN PATENT DOCUMENTS

CN         1741289 A      3/2006

* cited by examiner

*Primary Examiner*—Chuong A. Luu
(74) *Attorney, Agent, or Firm*—Andrew C. Cheng

(57) ABSTRACT

A light source device includes a lead frame, a first solid-state lighting chip, a first transparent encapsulation, a second solid-state lighting chip, and a second transparent encapsulation. The first solid-state lighting chip and the second solid-state lighting chip are respectively located at two opposite sides of the lead frame and electrically connected to the lead frame. The first transparent encapsulation and the second transparent encapsulation respectively encapsulate the first solid-state lighting chip and the second solid-state lighting chip.

19 Claims, 9 Drawing Sheets

LIGHT SOURCE DEVICE, LIGHT SOURCE MODULE, AND METHOD OF MAKING THE LIGHT SOURCE DEVICE

CROSS-REFERENCE TO RELATED APPLICATIONS

This application claims all benefits accruing under 35 U.S.C. §119 from China Patent Application No. 200710203223.8, filed on Dec. 19, 2007 in the China Intellectual Property Office, the disclosures of which are incorporated herein by reference.

BACKGROUND

1. Technical Field

The present invention generally relates to light source devices, light source modules, and methods of making the light source device.

2. Description of Related Art

Light emitting diodes (LEDs) as solid-state illuminating apparatuses, are being widely used in the illumination field to substitute for conventional fluorescent lamps due to their high brightness, long service lifetime, and wide color gamut. Relevant subject matter is disclosed in an article entitled "Solid-State Lighting: Toward Superior Illumination", published in *Proceedings of the IEEE*, Vol. 93, No. 10, by Michael S. Shur et al. in October, 2005, the disclosure of which is incorporated herein by reference.

Referring to FIG. 9, a conventional light source device 10 includes a lead frame 11, an LED chip 12, and a transparent encapsulation 13. The lead frame 11 includes a first electrode 111 and a second electrode 112. The LED chip 12 includes a first contacting electrode 121 and a second contacting electrode 122 opposite to the first contacting electrode 121. The first contacting electrode 121 is electrically connected to the first electrode 111. The second contacting electrode 122 of the LED chip 12 is bonded to the second electrode 112 using a gold wire 14. The first electrode 111 and the second electrode 112 are used to cooperatively supply electrical power to the LED chip 12. The transparent encapsulation 13 is used to encapsulat the LED chip 12, and has a hemispherical light emitting surface 131. Light beams from the LED chip 12 can only be emitted through the hemispherical light emitting surface 131. That is, the light beams can only emit along a single direction related to the LED chip 12, so that the light source device 10 has a small radiation range, which limits applications of the light source device 10.

What is needed, therefore, is a light source device, and a light source module having a large radiation range, and method of making the light source device, which can overcome the above-mentioned disadvantages.

SUMMARY

A light source device includes a lead frame, a first solid-state lighting chip, a first transparent encapsulation, a second solid-state lighting chip, and a second transparent encapsulation. The first solid-state lighting chip and the second solid-state lighting chip are respectively located at two opposite sides of the lead frame and electrically connected thereto. The first transparent encapsulation and the second transparent encapsulation respectively encapsulate the first solid-state lighting chip and the second solid-state lighting chip.

Other advantages and novel features will become more apparent from the following detailed description of the present invention, when taken in conjunction with the accompanying drawings.

BRIEF DESCRIPTION OF THE DRAWINGS

Many aspects of the present devices and methods can be better understood with reference to the following drawings. The components in the drawings are not necessarily drawn to scale, the emphasis instead being placed upon clearly illustrating the principles of the present devices and methods. Moreover, in the drawings, like reference numerals designate corresponding parts throughout the several views.

DETAILED DESCRIPTION

Figure 1:
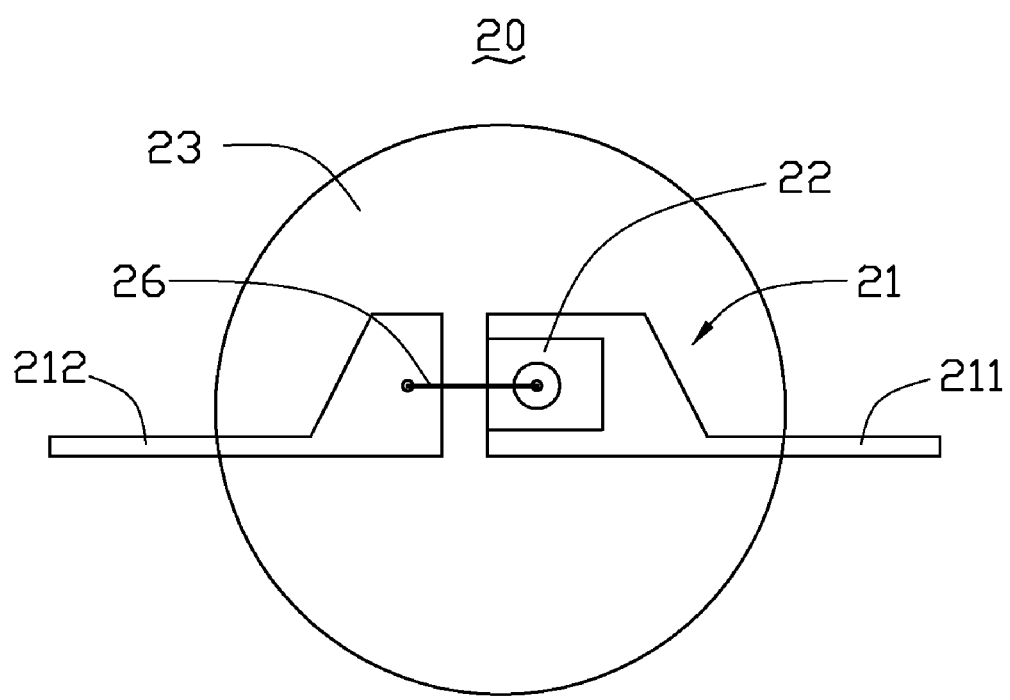
FIG. 1 is a top view of the light source device of a first exemplary embodiment of the present invention.
Figure 2:
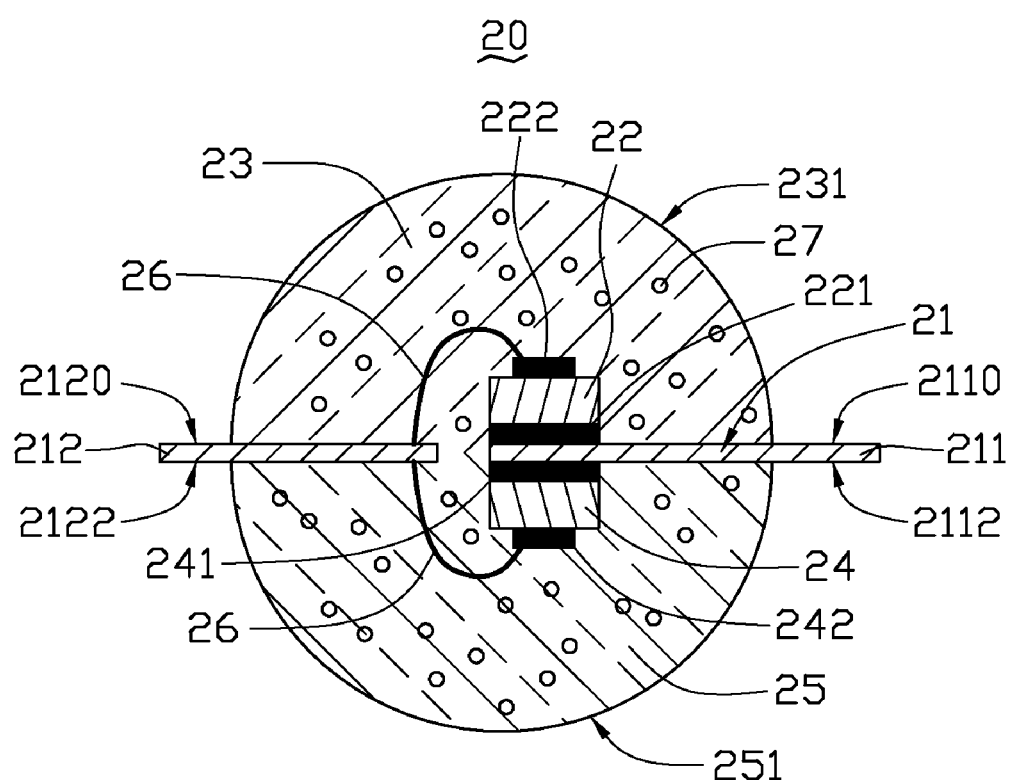
FIG. 2 is a cross-sectional view of the light source device in FIG. 1.

Referring to FIGS. 1 and 2, a light source device 20 in accordance with a first exemplary embodiment of the present invention includes a lead frame 21, a first solid-state lighting chip 22, a first transparent encapsulation 23, a second solid-state lighting chip 24, and a second transparent encapsulation 25. The solid-state lighting chips 22, 24 are LED chips 22, 24.

The lead frame 21 includes a first electrode 211 and a second electrode 212. The first and second electrodes 211, 212 are used to cooperatively supply electrical power to the LED chips 22, 24. The first electrode 211 includes a first surface 2110 and a second surface 2112 opposite to the first surface 2110. The second electrode 212 includes a first surface 2120 and a second surface 2122 opposite to the first surface 2120. The first surface 2110 of the first electrode 211 and the first surface 2120 of the second electrode 212 are located on the same side of the lead frame 21.

The first LED chip 22 includes a first contacting electrode 221 and a second contacting electrode 222 opposite to the first contacting electrode 221. The first LED chip 22 is placed on the first surface 2110 of the first electrode 211, and the first contacting electrode 221 of the first LED chip 22 is electrically connected to the first surface 2110 of the first electrode 211. The second contacting electrode 222 of the first LED chip 22 is wire bonded, using a gold wire 26, to the first surface 2120 of the second electrode 212.

The first transparent encapsulation 23 is placed on the first LED chip 22 to encapsulate the first LED chip 22, the gold wire 26, part of the first surface 2110, 2120. The first transparent encapsulation 23 has a first light emitting surface 231, and the light beams from the first LED chip 22 are emitted out of the light source device 20 through the first light emitting surface 231. The first light emitting surface 231 can be any curved surface providing a desired pattern of light transmission therethrough. In the present embodiment, the first light emitting surface 231 has a hemispherical profile, thus the light is not trapped in the first transparent encapsulation 23 by total internal reflection (TIR), thereby increasing light emission efficiency of the light source device 20. The first transparent encapsulation 23 may be comprised of silicone, epoxy resin, low temperature melting glass, or other non-opaque material. In the present embodiment, the first transparent encapsulation 23 is comprised of silicone.

The second LED chip 24 includes a first contacting electrode 241, and a second contacting electrode 242 opposite to the first contacting electrode 241. The second LED chip 24 is placed on the second surface 2112 of the first electrode 211. The first contacting electrode 241 of the second LED chip 24 is electrically connected to the second surface 2112 of the first electrode 211. The second contacting electrode 242 of the second LED chip 24 is wire bonded, using another gold wire 26, to the second surface 2122 of the second electrode 212.

The second transparent encapsulation 25 is placed on the second LED chip 24 to encapsulate the second LED chip 24, the gold wire 26, part of the second surface 2112, 2122. The second transparent encapsulation 25 is opposite to the first transparent encapsulation 23. The second transparent encapsulation 25 has a second light emitting surface 251, and the light beams from the second LED chip 24 are emitted out of the light source device 20 by the second light emitting surface 251. The second light emitting surface 251 and the first light emitting surface 231 are located on two opposite side of the lead frame 21, so the light beams out of the second transparent encapsulation 25 would substantially emit along a reverse direction comparing with the light beams out of the first transparent encapsulation 23. Like the first light emitting surface 231, the second light emitting surface 251 can be any curved surface providing the light beams out. In the present embodiment, the second light emitting surface 251 has a hemispherical profile. The second transparent encapsulation 25 may be comprised of silicone, epoxy resin, low temperature melting glass, or the other non-opaque material. In the present embodiment, second transparent encapsulation 25 is comprised of silicone.

The light source device 20 further includes many doping materials 27 distributed in the first and second transparent encapsulations 23, 25. The doping materials 27 may be scattering particles, and they are evenly distributed in the first and second transparent encapsulations 23, 25 or congregated to an area respectively near the first and the second light emitting surfaces 231, 251. The scattering particles are used to scatter the light beams transmitting into the first and second transparent encapsulation 23, 25, to improve light uniformity of the light source device 20. The scattering particles are made of $TiO_2$, plastic, PMMA, fused silica, $Al_2O_3$, MgO, sialon, or the other transparent nitrogen oxides. The refractive index of the scattering particles is in a range from 1.1 to 2.4, and it is different from the refractive index of first transparent encapsulation 23. In addition, the scattering particles may be spherical, strip shaped or otherwise.

The doping materials 27 may be phosphor materials, and they are evenly distributed in the first and second transparent encapsulation 23, 25 or congregated to an area respectively near the first and second light emitting surfaces 231, 251. The phosphor materials can be excited by light from the first LED chip 22 or the second LED chip 24 to emit light of a determined wavelength. The phosphor materials may be made of YAG, silicate, nitride, or oxide.

The doping materials 27 may be diamond powders, diamond-like powders, or other particles with high thermal conductivity. The thermal conductivity of the first and second transparent encapsulations 23, 25 is generally in a range of 1~2 W/m·K, but that of the diamond powders or diamond-like powders thermal conductivity is in a range of 300~1000 W/m·K, so that the first and second transparent encapsulations 23, 25 with the heat conduction particles therein has high thermal conductivity to more easily dissipate heat generated by the first LED chip 22 and the second LED chip 24, improving heat stability of the light source device 20. In addition, the first and second light emitting surfaces 231, 251 may have protrusions, grooves or other microstructures to increase the surface area of the first and second light emitting surfaces 231, 251, to improve the thermal diffusion efficiency of the light source device 20.

Because, the light source device 20 includes the first light emitting surface 231 and the second light emitting surface 251 opposite to first light emitting surface 231, light may be emitted in substantially opposite directions. Thus, the light source device 20 is a dual light source with large radiation range.

Figure 3:
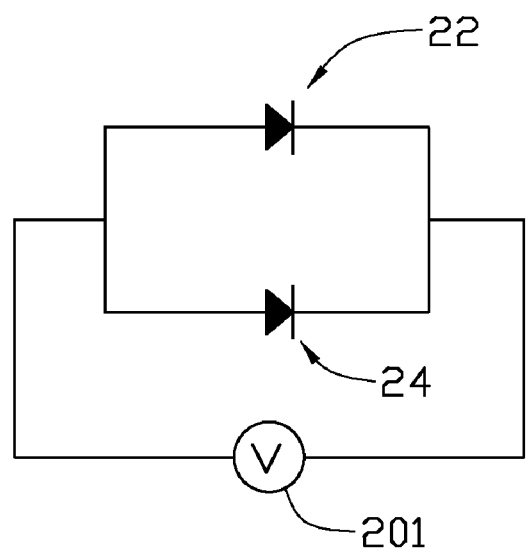
FIG. 3 is an equivalent circuit diagram of the light source device in FIG. 2.

Referring to FIG. 3, an equivalent circuit diagram of the light source device 20 connected to a power supply 201 is shown. The first LED chip 22 and the second LED chip 24 are connected in parallel. The first electrode 211 and the second electrode 212 are respectively connected to the power supply 201. The power supply 201 is used to supply power to the first LED chip 22 and the second LED chip 24.

The power supply 201 may be a DC power source or an AC power source. If the power supply 201 is a DC power source, the power supply 201 can drive the first LED chip 22 and the second LED chip 24 to be lit at the same time. If the power supply 201 is an AC power source, the first LED chip 22 and the second LED chip 24 can be shifted for lighting synchronously under the forward voltage of the AC power, and be shifted off synchronously under the inverse voltage of the AC power. Because the frequency of domestic AC power sources generally ranges from 50 Hz-60 Hz is faster than the 30 Hz limit that can be detected by humans. Therefore, it will appear that the LEDs 22, 24 are continuously lit.

Figure 4:
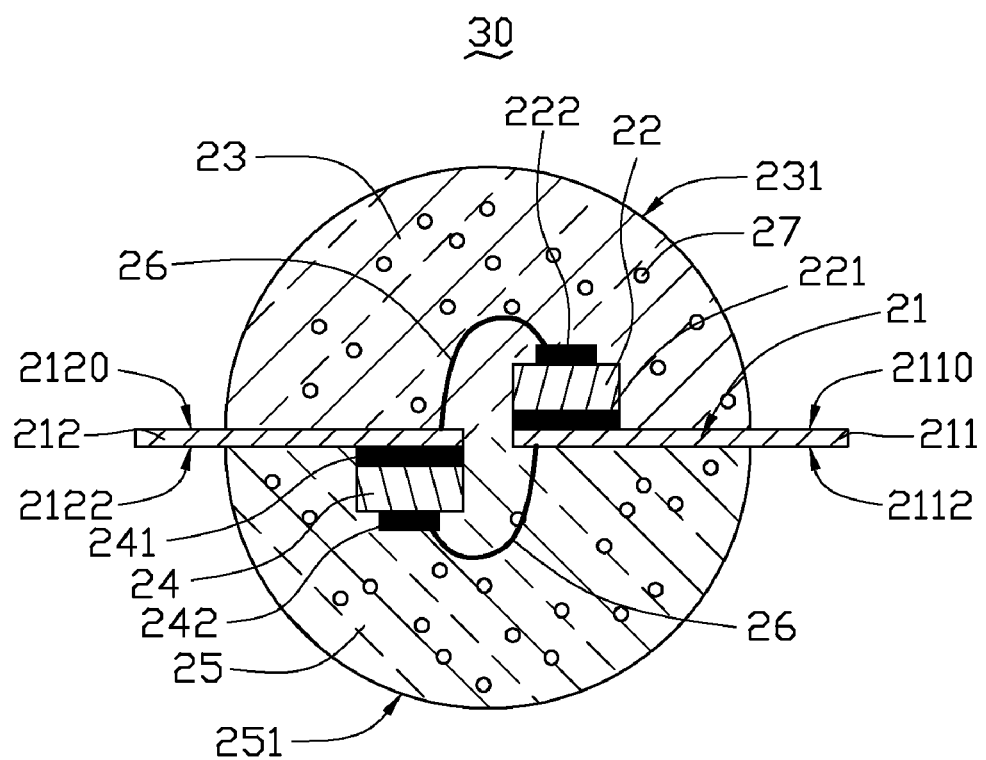
FIG. 4 is a cross-sectional view of the light source device of a second exemplary embodiment of the present invention.

Referring to FIG. 4, a light source module 30, in accordance with a second embodiment, is provided. The light source module 30 is similar to that of the first embodiment, except that the first LED chip 22 is placed on the first surface 2110 of the first electrode 211. The first contacting electrode 221 of the first LED chip 22 is electrically connected to the first surface 2110 of the first electrode 211. The second contacting electrode 222 of the first LED chip 22 is wire bonded, using a gold wire 26, to the first surface 2120 of the second electrode 212. The second LED chip 24 is placed on the second surface 2122 of the second electrode 212. The first contacting electrode 241 of the second LED chip 24 is electrically connected to the second surface 2122 of the second electrode 212. The second contacting electrode 242 of the second LED chip 24 is wire bonded, using another gold wire 26, to the second surface 2122 of the first electrode 211.

Figure 5:
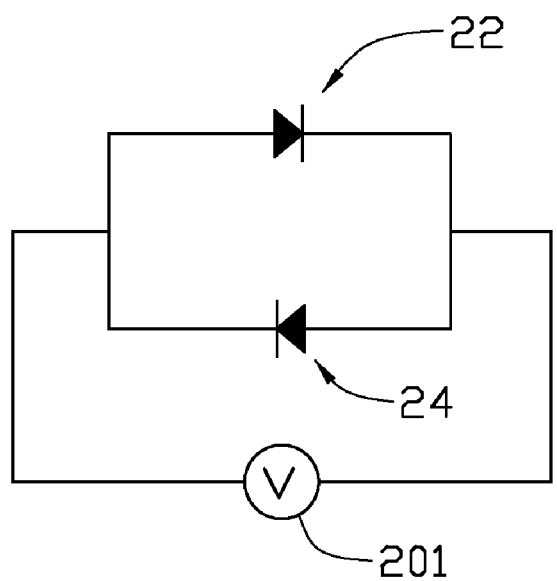
FIG. 5 is an equivalent circuit diagram of the light source device in FIG. 4.

Referring to FIG. 5, an equivalent circuit diagram of the light source device 30 connected to a power supply 201 is shown. The first electrode 211 and the second electrode 212 are respectively connected to the power supply 201.

If the power supply 201 is a DC power source, the power supply 201 can drive the first LED chip 22 or the second LED chip 24 lighting. If the power supply 201 is an AC power source, the first LED chip 22 and the second LED chip 24 can be respectively shifted for lighting under the forward voltage and the inverse voltage of the AC power, such as, the first LED chip 22 lighting under the forward voltage while the second LED chip 24 off, the first LED chip 22 off under the inverse voltage while the second LED chip 24 lighting. Because the first LED chip 22 and the second LED chip 24 are not kept lit continuously, less heat is produced, thus the light source device 20 has low working temperature, and the electrooptical efficiency of the first LED chip 22 and the second LED chip 24 is high. In addition, the first LED chip 22 and the second LED chip 24 may be flip-chip bonded on the lead frame. And the first transparent encapsulation 23 and the second transparent encapsulation 25 may be integrally formed.

Figure 6:
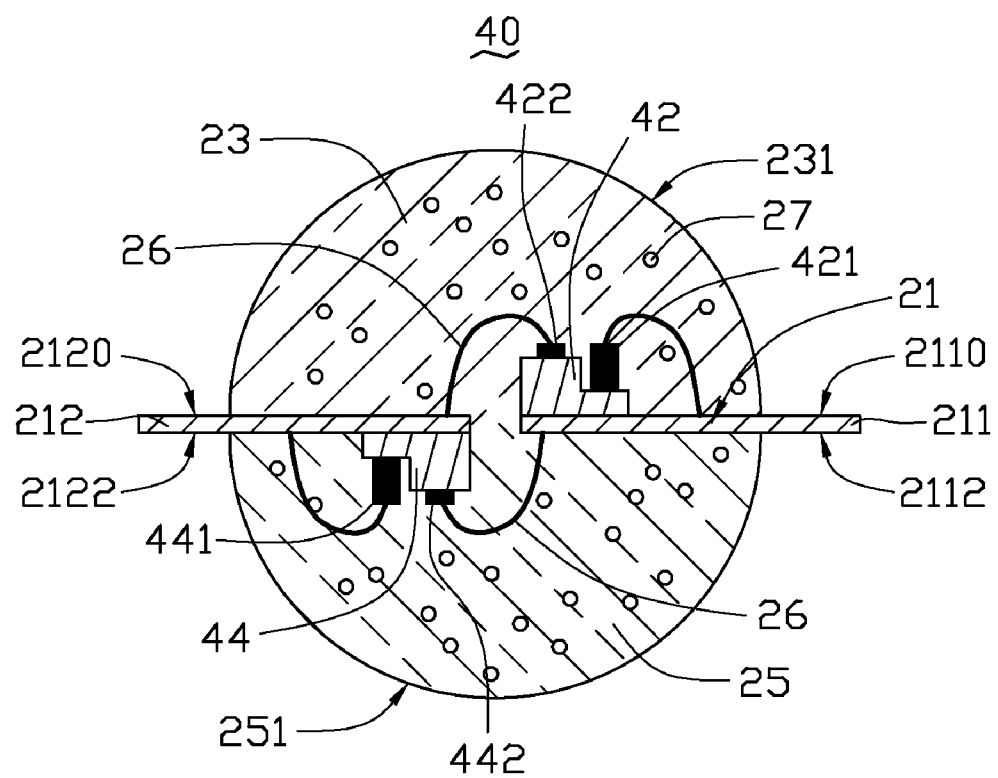
FIG. 6 is a cross-sectional view of the light source device of a third exemplary embodiment of the present invention.

Referring to FIG. 6, a light source module 40, in accordance with a third embodiment, is provided. The light source module 30 is similar to that of the second embodiment, except that a first LED chip 42 and a second LED chip 44. The first LED chip 42 includes a first contacting electrode 421 and a second contacting electrode 422 parallel with each other away from the first surface 2110 of the first electrode 211. The first contacting electrode 421 and the second contacting electrode 422 are respectively wire bonded to the first surface 2110 of the first electrode 211 and the first surface 2120 of the second electrode 212. The second LED chip 44 includes a first contacting electrode 441 and a second contacting electrode 442 parallel with each other away from the second surface 2122 of the second electrode 212. The first contacting electrode 441 and the second contacting electrode 442 are respectively wire bonded to the second surface 2122 of the second electrode 212 and the second surface 2112 of the first electrode 211.

Figure 7:
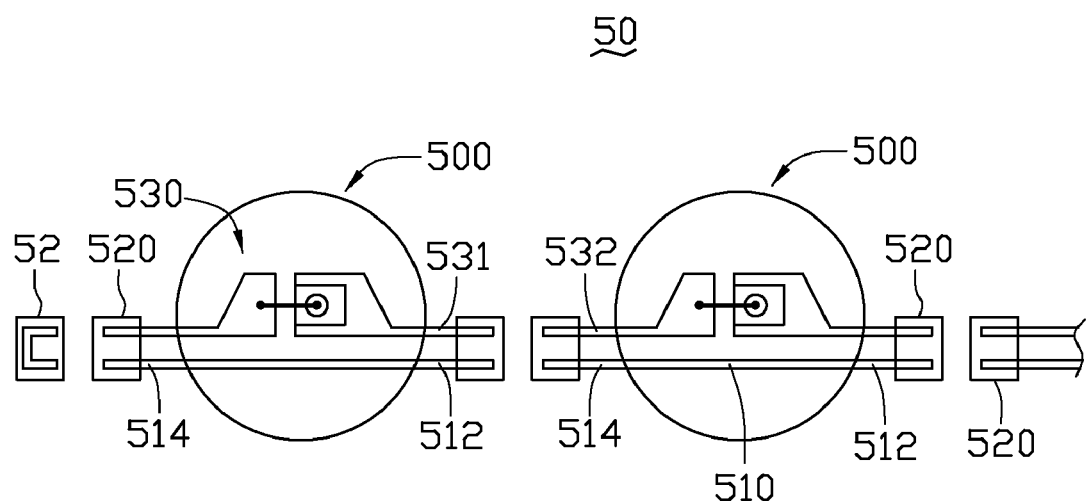
FIG. 7 is a top view of the light source module of a fourth exemplary embodiment of the present invention.

Referring to FIG. 7, a light source module 50, in accordance with a fourth embodiment, is provided. The light source module 50 includes a number of light source devices 500, which connected in series. The light source devices 500 each is similar to that of the first embodiment, except that the light source device 500 includes a conducting wire 510 and two connectors 520. The conducting wire 510 is juxtaposed with the lead frame 530. The conducting wire 510 is insulated with the lead frame 530. The conducting wire 510 has a first end 512, an opposite second end 514, and an intermediate portion embedded in at least one of the first and second transparent encapsulations which are similar with that in the first embodiment. The first end 512 and the second end 514 of the conducting wire 510 are exposed outside this first transparent encapsulation and the second transparent encapsulation which are similar with that in the first embodiment. Moreover, the first end 512 of the conducting wire 510 and the first electrode 531 cooperatively form a first connector terminal, and the second end 514 of the conducting wire 510 and the second electrode 532 cooperatively form a second connector terminal. The connector 520 is configured for electrically coupling a first connector terminal of one light source device 500 to a second connector terminal of another adjacent light source device 500. In the present embodiment, the light source module 50 further includes a loopback 52, the light source devices 500 are connected in series to form a light source assembly, and the loopback 52 is electrically coupled to the first connector terminal of the light source device 500 at one distal end of the light source assembly. The second connector terminal of the light source device 500 at another distal end of the light source assembly is configured for electrical connection to a DC or AC power supply.

The light source module 50 may include a number of light source devices 20 in accordance with the first embodiment which connected in series. The electrodes of light source devices 20 which located at two ends of the light source module 50 may connect to a power supply, to drive the light source module 50 lighting.

The light source devices 500 of the light source module 50 can also be connected with each other by the other modes, such as parallel mode, series-parallel mode.

Figure 8:
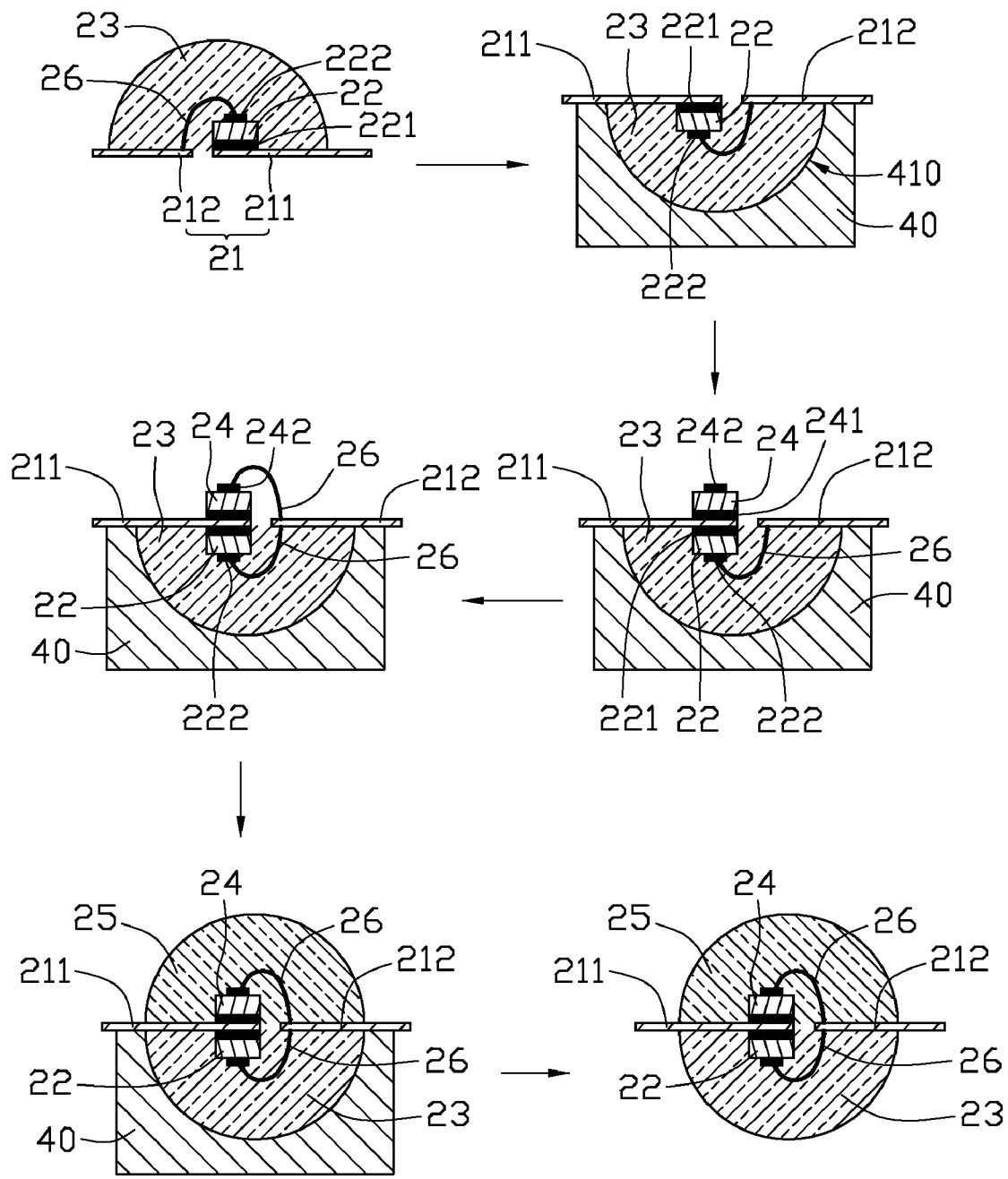
FIG. 8 is schematic, manufacturing process of the method of making light source device of a fifth exemplary embodiment of the present invention.
Figure 9:
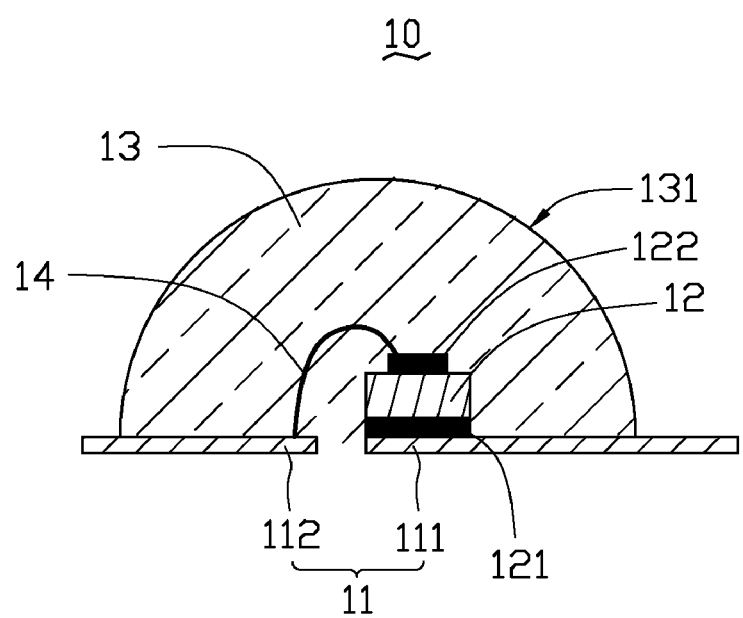
FIG. 9 is a cross-sectional view of the conventional light source device.

Referring to FIG. 8, a method of making the light source device, in accordance with a fifth embodiment, is provided. The method includes:

(1) providing a first LED chip 22 and a lead frame 21 has a first electrode 211 and a second electrode 212, the first LED chip 22 includes a first contacting electrode 221, and an opposite second contacting electrode 222; agglutinating the first electrode 211 of the lead frame 21 and the first contacting electrode 221 of the first LED chip 22 to form electrical connection; welding a gold wire 26 on the second contacting electrode 222 of the first LED chip 22 and the second electrode 212 of the lead frame 21 to form electrical connection; molding a first transparent encapsulation 23 on the first LED chip 22.

(2) providing a holding stage 40 has a receiving groove 410, and placing the first transparent encapsulation 23 into the receiving groove 41.

(3) providing a second LED chip 24 included a first contacting electrode 241, and an opposite second contacting electrode 242; agglutinating the first contacting electrode 241 of the second LED chip 24 on an opposite side of the first electrode 211 to the first LED chip 22 to form electrical connection.

(4) welding a gold wire 26 on the second contacting electrode 242 of the second LED chip 24 and the second electrode 212 of the lead frame 21 to form electrical connection.

(5) molding a second transparent encapsulation 25 on the second LED chip 24 to form the light source device 20.

(6) demounting the light source device 20 from the holding stage 40.

In the present embodiment, the first LED chip 22 and the second LED chip 24 may be bonded with the first electrode 211 by die attach adhesive. When respectively forming the first transparent encapsulation 23 and the second transparent encapsulation 25 on the first LED chip 22 and the second LED chip 24, parts of the first electrode 211 and the second electrode 212 can be covered, and the uncovered part thereof may be coated by insulating layer, such as insulation plastic, to protect the first electrode 211 and the second electrode 212.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A light source device comprising:
   a lead frame, a first solid-state lighting chip, a first transparent encapsulation, a second solid-state lighting chip, and a second transparent encapsulation;
   wherein the first solid-state lighting chip and the second solid-state lighting chip are respectively located at two opposite sides of the lead frame and electrically connected thereto; and the first transparent encapsulation and the second transparent encapsulation form a spherical profile and respectively encapsulate the first solid-state lighting chip and the second solid-state lighting chip.

2. The light source device of claim 1, wherein the first solid-state lighting chip and the second solid-state lighting chip are electrically connected in parallel.

3. The light source device of claim 1, wherein the first solid-state lighting chip and the second solid-state lighting chip are electrically connected in inverse parallel.

4. The light source device of claim 1, wherein the first transparent encapsulation and the second transparent encapsulation contain at least one of scattering particles, a phosphor material, and heat conduction particles therein.

5. The light source device of claim 1, wherein the lead frame includes a first electrode and a second electrode, the first electrode includes a first surface and an opposite second surface opposite, the first solid-state lighting chip is placed on the first surface of the first electrode, the second solid-state lighting chip is placed on the second surfaced of the first electrode, and the first solid-state lighting chip and the second solid-state lighting chip are connected to the first electrode and the second electrode.

6. The light source device of claim 1, wherein the lead frame includes a first electrode and a second electrode, the first solid-state lighting chip is placed on a first surface of the first electrode, the second solid-state lighting chip is placed on a second surface of the second electrode, the first surface of the first electrode and the second surface of the second electrode are respectively located at two opposite sides of the lead frame, and the first solid-state lighting chip and the second solid-state lighting chip are connected to the first electrode and the second electrode.

7. The light source device of claim 1, further comprising a conducting wire juxtaposed with the lead frame, the conducting wire having a first end, an opposite second end, and an intermediate portion embedded in at least one of the first transparent encapsulation and the second transparent encapsulation, the first end and the second end of the conducting wire exposed outside the first transparent encapsulation and the second transparent encapsulation.

8. The light source device of claim 7, wherein the first end of the conducting wire and the first electrode cooperatively form a first connector terminal, and the second end of the conducting wire and the second electrode cooperatively form a second connector terminal.

9. The light source device of claim 8, further comprising a connector, wherein the connector is configured for electrically coupling a first connector terminal of one light source device to a second connector terminal of another similar light source device.

10. A light source module, comprising a plurality of light source devices electrically connected to each other, each of the light source devices comprising:
  a lead frame,
  a first solid-state lighting chip;
  a second solid-state lighting chip, the first solid-state lighting chip and the second solid-state lighting chip being respectively located at two opposite sides of the lead frame and electrically connected thereto;
  a first transparent encapsulation encapsulating the first solid-state lighting chip;
  a second transparent encapsulation encapsulating the second solid-state lighting chip, the first transparent encapsulation and the second transparent encapsulation forming a spherical profile;
  a conducting wire, juxtaposed with the lead frame, the conducting wire having a first end, an opposite second end, and an intermediate portion embedded in at least one of the first transparent encapsulation and the second transparent encapsulation, the first end and the second end of the conducting wire exposed outside the first transparent encapsulation and the second transparent encapsulation, the first end of the conducting wire and the first electrode cooperatively form a first connector terminal, and the second end of the conducting wire and the second electrode cooperatively form a second connector terminal; and
  at least one connector, configured for electrically coupling a first connector terminal of one light source device to a second connector terminal of another similar light source device.

11. The light source module of claim 10, further comprising a loopback, wherein the light source devices are connected in series to form a light source assembly, and the loopback is electrically coupled to the first connector terminal of the light source device at one distal end of the light source assembly, the second connector terminal of the light source device at another distal end of the light source assembly is configured for electrical connection to a power supply.

12. A light source device comprising:
  a lead frame, a first solid-state lighting chip, a first transparent encapsulation, a second solid-state lighting chip, and a second transparent encapsulation;
  wherein the first solid-state lighting chip and the second solid-state lighting chip are respectively located at two opposite sides of the lead frame and electrically connected thereto; and the first transparent encapsulation and the second transparent encapsulation respectively encapsulate the first solid-state lighting chip and the second solid-state lighting chip; and
  wherein the first transparent encapsulation has a first light emitting surface, and light beams from the first solid-state lighting chip are emitted out of the light source device through the first light emitting surface, the second transparent encapsulation has a second light emitting surface, and light beams from the second solid-state lighting chip are emitted out of the light source device through the second light emitting surface.

13. The light source device of claim 12, wherein the lead frame comprises a first electrode and a second electrode, the first and second solid-state lighting chips are respectively mounted on two opposite sides of the first electrode of the lead frame and electrically connected therewith, the first and second solid-state lighting chips are electrically connected to the second electrode through metal wires connecting the first and second solid-state lighting chips and the second electrode.

14. The light source device of claim 12, wherein the first transparent encapsulation and the second transparent encapsulation cooperatively form a spherical profile.

15. The light source device of claim 13, wherein the first transparent encapsulation and the second transparent encapsulation cooperatively form a spherical profile.

16. The light source device of claim 12, wherein the lead frame comprises a first electrode and a second electrode, the first solid-state lighting chip is mounted on a first side of the first electrode and electrically connecting therewith and the second solid-state lighting chip is mounted on a second side of the second electrode opposite the first side of the first electrode and electrically connecting therewith, the first solid-state lighting chip has a contacting electrode electrically connected to the second electrode via a metal wire, the second solid-state lighting chip has a contacting electrode electrically connected to the first electrode via a metal wire.

17. The light source device of claim 16, wherein the first transparent encapsulation and the second transparent encapsulation cooperatively form a spherical profile.

18. The light source device of claim 12, wherein the lead frame comprises a first electrode and a second electrode, the first solid-state lighting chip is mounted on a first side of the first electrode and the second solid-state lighting chip is mounted on a second side of the second electrode opposite the first side of the first electrode, the first solid-state lighting chip has contacting electrodes electrically connected to the first and second electrodes via metal wires, the second solid-state lighting chip has contacting electrodes electrically connected to the first and second electrodes via metal wires.

19. The light source device of claim 18, wherein the first transparent encapsulation and the second transparent encapsulation cooperatively form a spherical profile.

* * * * *